United States Patent [19]

Butts

[11] Patent Number: 6,054,864

[45] Date of Patent: *Apr. 25, 2000

[54] IN-CIRCUIT CAPACITOR CHECKER

[76] Inventor: Joseph R. Butts, 207 Fonnic Dr., Goodlettsville, Tenn. 37072

[*] Notice: This patent issued on a continued prosecution application filed under 37 CFR 1.53(d), and is subject to the twenty year patent term provisions of 35 U.S.C. 154(a)(2).

[21] Appl. No.: 08/746,930

[22] Filed: Nov. 18, 1996

[51] Int. Cl.[7] .................................................. G01R 11/52
[52] U.S. Cl. ........................... 324/548; 324/682; 324/555
[58] Field of Search ................................... 324/686, 682, 324/548, 555, 658, 601, 603

[56] References Cited

U.S. PATENT DOCUMENTS

| | | | |
|---|---|---|---|
| 1,217,827 | 2/1917 | Romain | 324/658 |
| 2,567,587 | 9/1951 | Wilchinsky | 324/682 |
| 2,599,528 | 6/1952 | Beveridge | 324/682 |
| 2,617,859 | 11/1952 | Kraft | 324/682 |
| 2,621,517 | 12/1952 | Sontheimer | 324/682 |
| 3,218,550 | 11/1965 | Merriam | 324/682 |
| 3,255,409 | 6/1966 | Sztybel | 324/682 |
| 3,518,537 | 6/1970 | McFee | 324/682 |
| 3,774,237 | 11/1973 | Hardway, Jr. | 324/61 |
| 3,786,349 | 1/1974 | Devenyi | 324/57 |
| 3,855,527 | 12/1974 | Masopust, Jr. | 324/60 |
| 3,943,439 | 3/1976 | Raymond | 324/60 |
| 4,216,424 | 8/1980 | Vette | 324/62 |
| 4,425,541 | 1/1984 | Burkum et al. | 324/51 |
| 4,570,116 | 2/1986 | Tedd et al. | 324/57 |
| 4,683,417 | 7/1987 | De Burgat et al. | 324/60 |
| 4,795,966 | 1/1989 | Cook | 324/60 |
| 4,841,228 | 6/1989 | Noguchi et al. | 324/62 |
| 5,150,062 | 9/1992 | Takeuchi | 324/682 |

*Primary Examiner*—Diep N. Do
*Assistant Examiner*—Jose M. Solis
*Attorney, Agent, or Firm*—Eugene M. Cummings

[57] ABSTRACT

A capacitor test apparatus for checking the capacitance of a capacitor without removing the capacitor from the circuit. Selection of the designated capacitance of the capacitor by means of a user-actuated selector switch automatically selects a test signal frequency such that the reactance of the capacitor matches a reference impedance. A indicator circuit compares the actual reactance with the reference impedance to indicate the deviation of the test capacitor from its designated capacitance. The test signal is a low level sine wave which does not exceed the conduction threshold of semiconductor junctions associated with the capacitor. A user-actuated switch is provided for discharging any charge present on the capacitor prior to testing.

1 Claim, 6 Drawing Sheets

CAPACITANCE (MFD)

IN-CIRCUIT CAPACITOR CHECKER

BACKGROUND OF THE INVENTION

The present invention relates generally to test apparatus, and more particularly to test apparatus for quickly and efficiently in-circuit testing capacitors.

Various types of test apparatus have been developed for measuring the capacitance of a capacitor. Typically, these apparatus have employed an AC bridge, wherein the capacitor under test is included in one leg of the bridge and compared against a known component in the opposite leg of the bridge.

Unfortunately, such bridge arrangements, because of the need for first reconnecting the capacitor and then balancing the bridge, are not satisfactory for performing the rapid in-circuit capacitor checking frequently performed by radio and television repairmen. The present invention is directed to a test apparatus specifically suited for this purpose.

Unlike prior-art test apparatus, the present invention functions by applying a low-level AC signal to a capacitor of a designated capacitance while the capacitor remains connected. The frequency of this signal is user-selected such that the reactance exhibited by the capacitor to the applied signal is a pre-determined known constant if the capacitor has the specified capacitance. If the capacitor is of either higher or lower capacitance, the reactance is not the predetermined constant and a meter or other indicator signals a deviation.

In particular, the reactance $X_c$ of a test capacitor of capacitance C is a function of the frequency f of an applied AC signal, according to the equation $$X_C = \frac{1}{2\pi f C}$$

If $X_c$ is a constant $K_x$, then $$K_X = \frac{1}{2\pi f C}$$

and $$f = \frac{1}{2\pi K_X C}$$

where f is the frequency applied to the capacitor under test to achieve the predetermined reactance $K_x$.

In the test apparatus of the invention, one such frequency f is selected in accordance with this equation for each designated capacitor capacitance C whereby the reactance constant $K_x$ is always achieved if the capacitor under test is of the designated capacitance.

The frequency selection is automatically accomplished by the user simply selecting the designated capacitance allowing for a quick check of the capacitor without the user having to refer to charts or balance a bridge.

SUMMARY OF THE INVENTION

The electrical test circuit of the present invention provides a fast, accurate and easy to use capacitance checker for in-circuit evaluation of capacitors.

The invention is directed to a test apparatus for testing a capacitor having a designated capacitance and an actual capacitance. The test apparatus comprises selection means user-actuable to the designated capacitance of the capacitor under test, oscillator means for generating a test signal with a frequency dependant on the setting of the capacitance selection means, probe means for applying the test signal to the capacitor, the resulting impedance of the capacitor being a function of the frequency of the applied test signal and the actual capacitance of the capacitor, the frequency of a test signal causing the capacitor of the designated capacitance to have a reference impedance, and indicator means responsive to the difference between the resulting impedance of the capacitor and the reference impedance for indicating the magnitude deviation of the actual capacitance of the capacitor from its designated capacitance.

BRIEF DESCRIPTION OF THE DRAWINGS

The features of the present invention which are believed to be novel are set forth with particularity in the appended claims. The invention, together with the further objects and advantages thereof, may best be understood by reference to the following description taken in conjunction with the accompanying drawings, in the several figures of which like reference numerals identify like elements, and in which:

DESCRIPTION OF THE PREFERRED EMBODIMENT

Figure 1:
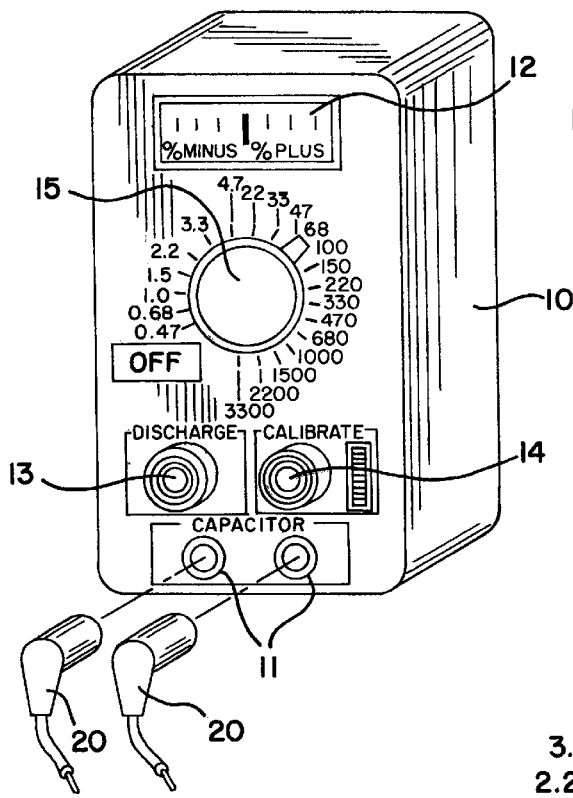
FIG. 1 is a perspective view of a test instrument incorporating the present invention.
Figure 2:
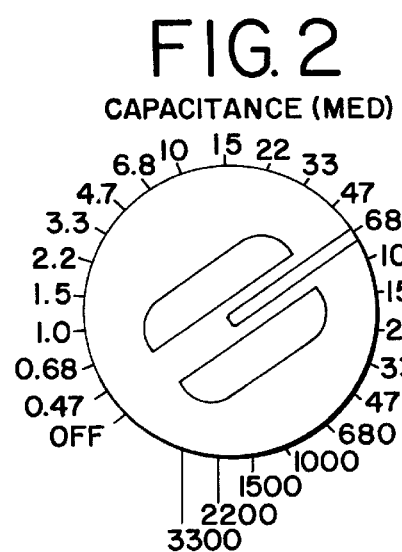
FIG. 2 is an enlarged view of the user-actuable switch incorporated in the test apparatus of FIG. 1 to enable user selection of designated capacitance values for a capacitor under test.

Referring to Figures, and particularly to FIG. 1, there is illustrated an example of an in-circuit capacitor checker 10 incorporating the teachings of the present invention. The checker 10 is seen to include a pair of receptacles 11 for receiving test leads, a deviation meter 12, a discharge pushbutton switch 13, a calibrate pushbutton switch 14 and a designated capacitance selector knob 15. FIG. 2 provides a close up view of the selector knob 15 used on the capacitor checker illustrated in FIG. 1. Around the edge of knob 15 are indicia corresponding to the designated capacitance in microfarads of a capacitor to be tested. The knob 15 provides a way for the user to select the designated capacitance value of the capacitor under test, by turning the knob to point to the desired value. In this illustration the same knob that selects the capacitance test value is also used to switch the unit off by turning the knob to the OFF indicia located at the edge of the knob.

Figure 3:
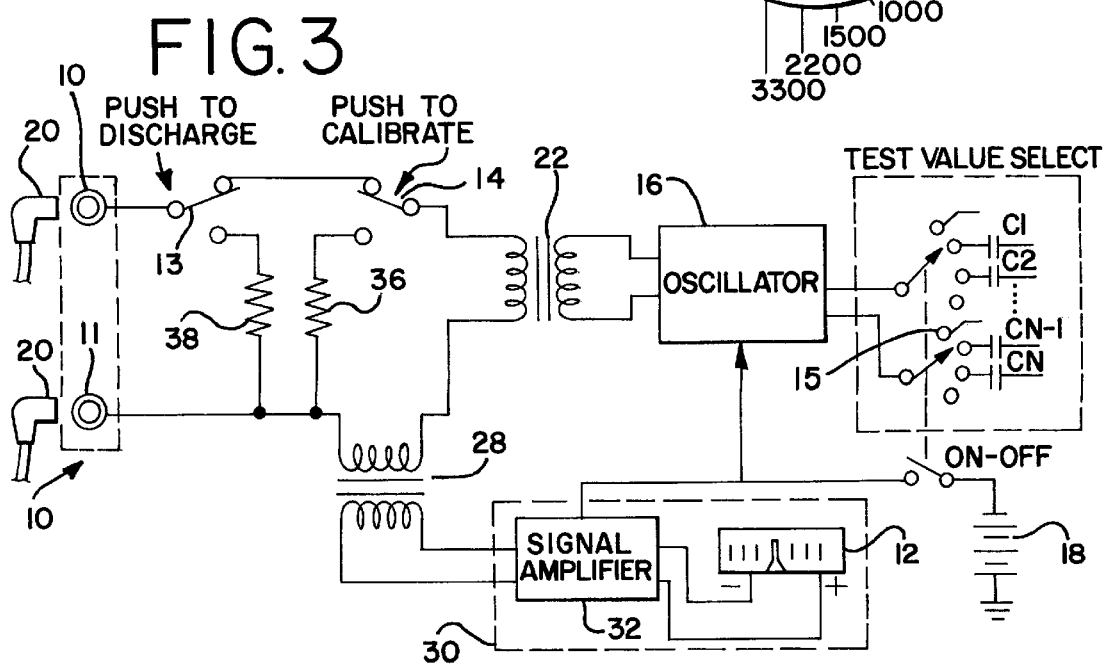
FIG. 3 is a simplified functional block diagram partially in schematic form, of an in-circuit capacitor checker designed according to the teachings of the present invention.

FIG. 3 shows a block diagram of an in-circuit capacitor checker 10 constructed according to the teachings of the present invention. The in-circuit capacitor checker 10 contains a test value select means used for selecting the capacitance value the circuit will test for. The test value select means includes knob 15, which is the circuit schematic equivalent to the knob shown in FIG. 2, which selectively couples different value capacitors (C1, C2, . . . C(n–1), C(n)) to the oscillator circuit 16. The different value capacitors 17, C1 through C(n), causes the oscillator circuit 16 to operate at a frequency such that a constant equivalent reference impedance may be used for all designated capacitance values. The knob 15, additionally, selectively couples and decouples the positive terminal of the battery to the positive voltage supply for switching the circuit on or off. The negative terminal is connected to ground.

The oscillator circuit 16 generates a sine wave of the appropriate frequency and transmits the signal to a pair of probes 20 coupled to the oscillator circuit 16 through a transformer 22, a calibration switch 24, a discharge switch 26 and a transformer 28. Each probe connects to a respective lead of the capacitor to be tested.

The transformer 22 provides DC isolation of the test circuit from the capacitor under test. Similarly transformer 28 provides DC isolation between the probes 20 and indicator circuit 30.

Indicator circuit 30 compares the voltage associated with the resulting reactances of the capacitor to the voltage associated with the reference impedance to generate a comparison signal. This signal is amplified by a signal amplifier circuit 32 and utilized to drive meter 12. If the actual capacitance of the capacitor under test equals the designated capacitance of the capacitor, the needle of the meter is centered on the meter scale. Any difference in the actual capacitance from the designated capacitance selected by knob 15 causes meter 12 to show a deviation from center in a direction and amplitude proportional to the percentage difference of actual capacitance to designated capacitance. If the actual capacitor under test is shorted, the meter shows an off the scale indication on the positive side. An open capacitor will show no movement of the needle leaving it at the far negative side of the scale.

The resulting reactance is the actual reactance of the capacitor attached to probes 20. The reactance of a capacitor is equal to $\frac{1}{2}\pi FC$, where C is capacitance and f is the frequency of the applied signal. Because the reactance is dependant on the frequency of the test signal, the test signal frequency must be different for each value of capacitance tested in order for the reference impedance to remain constant over the various capacitances tested. Hence oscillator circuit 16 needs to supply a different frequency signal for each capacitance value tested. Higher capacitance capacitors require a lower frequency signal in order for the reference impedance to remain constant.

A calibration switch 24 is provided to place the apparatus in a calibration mode. When the calibration switch 24 is actuated probes 20 are decoupled from the oscillator circuit 16 and a resistor 36 of known value is placed in the circuit loop. The value of resistor 36 is equivalent to the reference impedance such that the indicator circuit 30 signals a successful test by the needle being centered on meter 34. If the needle is not centered circuit 10 is out of adjustment and needs to be calibrated. Because the calibration impedance is a resistor, it is frequency independent so it does not matter what frequency the test value select means 12 is set to when calibrating the circuit.

The discharge switch 26 when pressed disconnects oscillator circuit 16 from probes 20 and connects a current limiting resistor 38. Any charge stored on the capacitor dissipates through resistor 38. This is important because an accurate test of the capacitor cannot be conducted if the capacitor contains a charge.

An additional feature of circuit 10 is its ability to measure capacitance of a capacitor while the component remains in the circuit. This is made possible by making the amplitude of the test signal generated by the oscillator 16 fairly small, for example, around 30 millivolts. The test signal level must be low enough to be below the conduction threshold of all semiconductor junctions such as diodes, transistors and integrated circuits. Additionally, a low level test signal allows the probes 20 to be connected to the capacitor, disregarding polarity, without fear of harming the capacitor.

Figure 4:
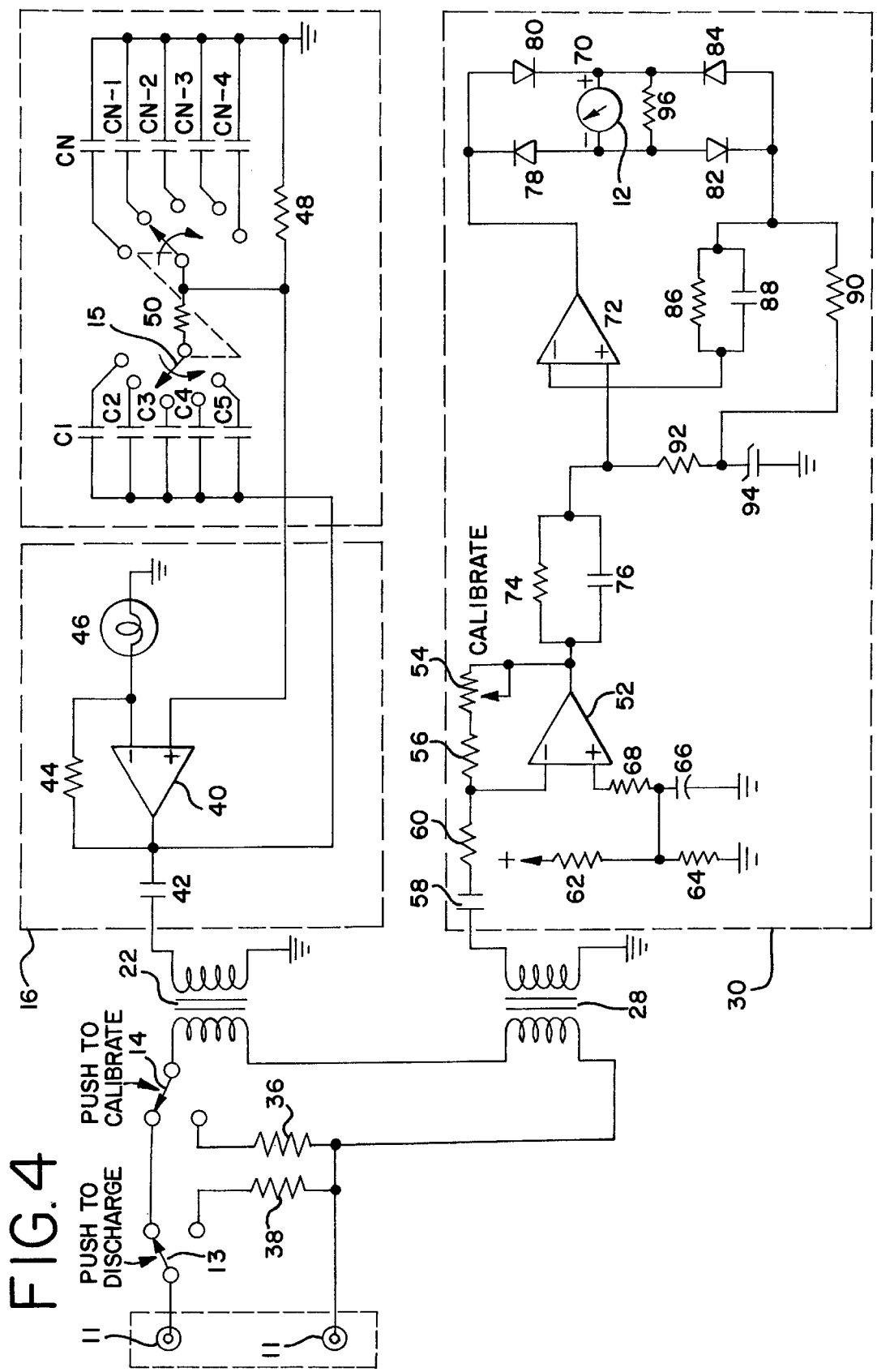
FIG. 4 is a simplified schematic diagram of an in-circuit capacitor checker designed according to the teachings of the present invention.

FIG. 4 is a more detailed circuit diagram of an in-circuit capacitor checker constructed according to the teachings of the present invention. FIG. 4 is essentially a more detailed version of FIG. 3 with the exception that FIG. 4 does not show the battery 18 or the on-off switch associated with the battery. Because the general description of FIG. 3 applies to FIG. 4, only the circuit blocks of FIG. 4 containing more detail will be discussed.

The oscillator circuit 16 of FIG. 4 comprises a Wien-bridge type oscillator. The Wien-bridge oscillator is actually the combination of the oscillator circuit 16 and the test value select circuit 12.

At the heart of the oscillator circuit 16 is an operational amplifier 40. The output of the operational amplifier 40 is coupled to transformer 22 through capacitor 42. The output of the operational amplifier 40 is fed back through a resistor 44 to the negative input of the operational amplifier 40. The negative input is coupled to ground through a lamp 46. Resistor 44 and lamp 46 provide amplitude-stabilizing negative feedback. The positive input of the operational amplifier 40 is coupled to ground through resistor 48. In parallel with resistor 48 also coupling the positive input terminal to ground is one of the selected capacitors C(n) to C(n–4). The output of the operational amplifier 40 is fed back to the positive input terminal of the operational amplifier 40 through resistor 50 in series with one of the second group of selected capacitors C1 to C5. The frequency of the oscillator circuit 16 is determined by the formula $f=1/(2\pi RC)$. R is the square root of the product of resistor 48 and resistor 50. C is the square root of the product of the selected capacitor from the first group C(n) to C(n–4) and the selected capacitor from the second group C1 to C5. By selecting different values for the capacitors the frequency of the oscillator changes. The preferred embodiment establishes the frequencies so that the reference impedance is around 10 ohms.

The indicator means 30 of the preferred embodiment of FIG. 4 contains two stages of amplification. The first stage contains the operational amplifier 52. The output of operational amplifier 52 is fed back and coupled to the negative input of the operational amplifier 52 through variable resistor 54 in series with resistor 56. The negative input of the operational amplifier 52 is coupled to transformer 28 for receiving the resulting reactance through capacitor 58 in series with resistor 60. The gain of the first amplification stage can be modified by adjusting variable resistor 54 providing a means to calibrate the circuit. Resistor 62 is coupled to resistor 64 in series as a voltage divider between the positive voltage source and ground to establish the reference voltage. The reference voltage is coupled to ground through capacitor 66. The reference voltage is coupled to the positive input terminal of operational amplifier 52 through resistor 68. The first stage of amplification performs the comparison between the reference impedance and the resulting reactance.

The second stage amplifier drives the meter 70. The second stage amplifier is centered around operational amplifier 72. The positive input terminal of operational amplifier 72 is coupled to the output of operational amplifier 52 through resistor 74 in parallel with capacitor 76. The output of operational amplifier 72 is coupled to the cathode of diode 78 and the anode of diode 80. The negative input terminal of operational amplifier 72 is coupled to the cathode of diode 82 and the anode of diode 84 through the feed back path of resistor 86 in parallel with capacitor 88. The positive input terminal of operational amplifier 72 is coupled to the cathode of diode 82 and the anode of diode 84 through the feed back path of resistor 90 in series with resistor 92 with the node between resistors 90 and 92 coupled to ground through capacitor 94. The negative terminal of the meter 70 is coupled to both the anode of diode 78 and the anode of diode 82. The positive terminal of the meter 70 is coupled to both the cathode of diode 80 and the cathode of diode 84. Resistor 96 is in parallel with meter 70.

Diodes 78, 80, 82 and 84 form a full wave rectifier. This converts the alternating current signal to a direct current signal for the meter. This also has the effect of eliminating any phase shift that might be present in the alternating current signal.

Figure 5:
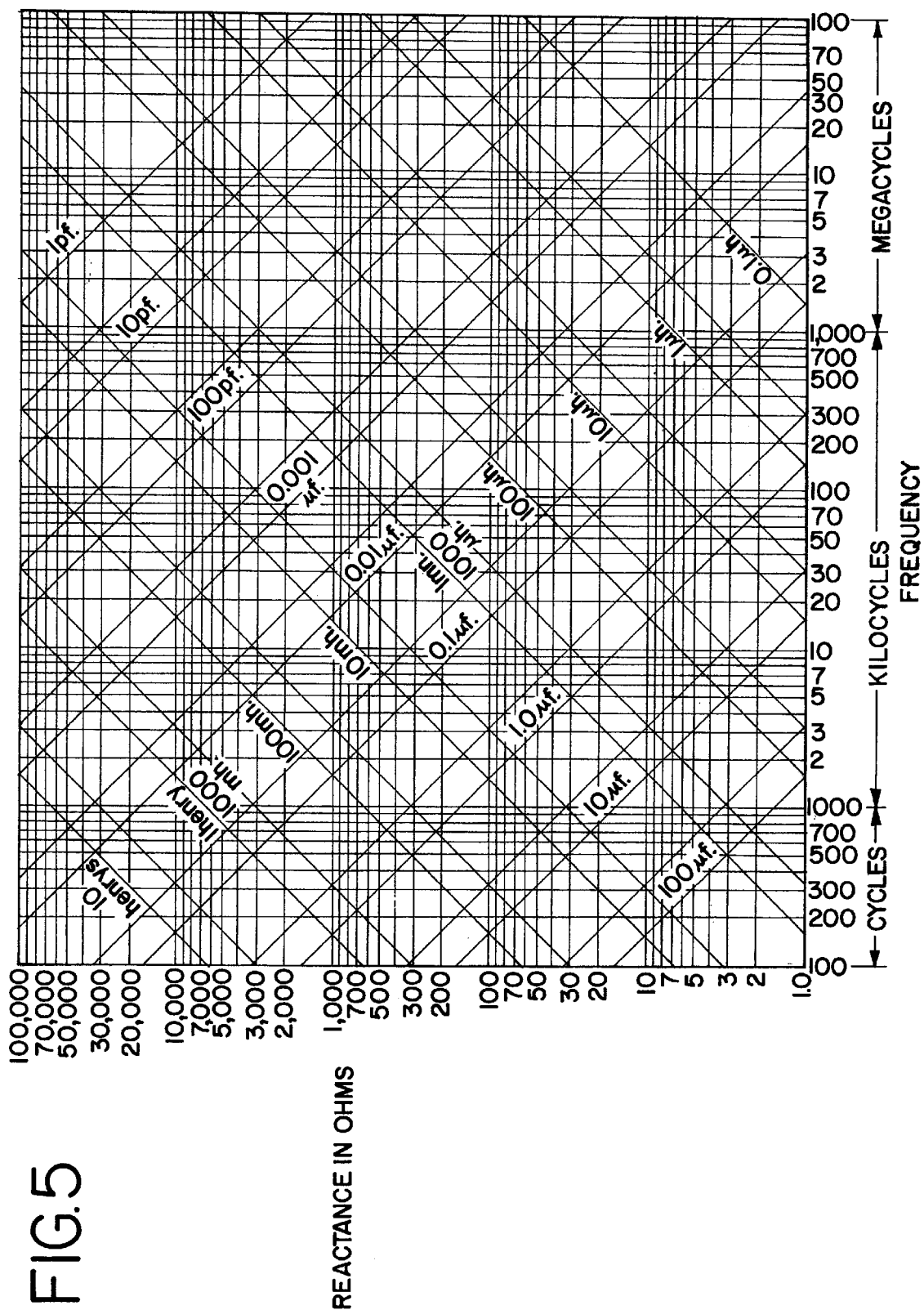
FIG. 5 is a depiction of capacitive reactance versus applied frequency useful in understanding the operation of the invention.

For example, referring to FIG. 5, for a constant reactance of 10 ohms, the following test frequencies are selected:

| Designated Capacitance (μfd) | Test Frequency (Kilohertz) |
| --- | --- |
| 1.0 | 0.17 |
| 0.1 | 1.70 |
| 0.01 | 17.0 |

With rotation of selector 15 capacitors 17 are automatically selected which will cause oscillator 16 to operate at the corresponding test frequency.

Figure 6:
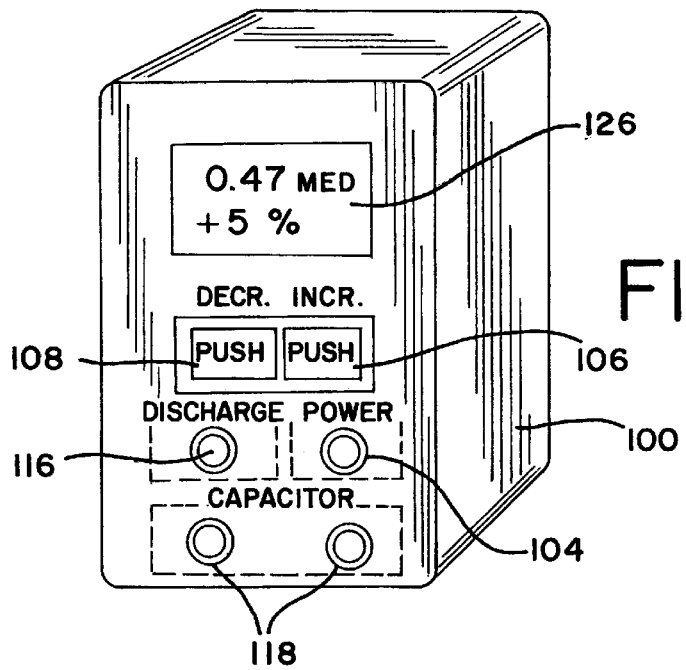
FIG. 6 is a perspective view of an alternate form of the invention incorporating a microprocessor and digital signal processing.

FIG. 6 in an example of an alternative form of an in-circuit capacitor checker incorporating the teachings of the present invention. FIG. 6 is what a test instrument might look like if it contained the capacitor checker circuit of FIG. 7.

Figure 7:
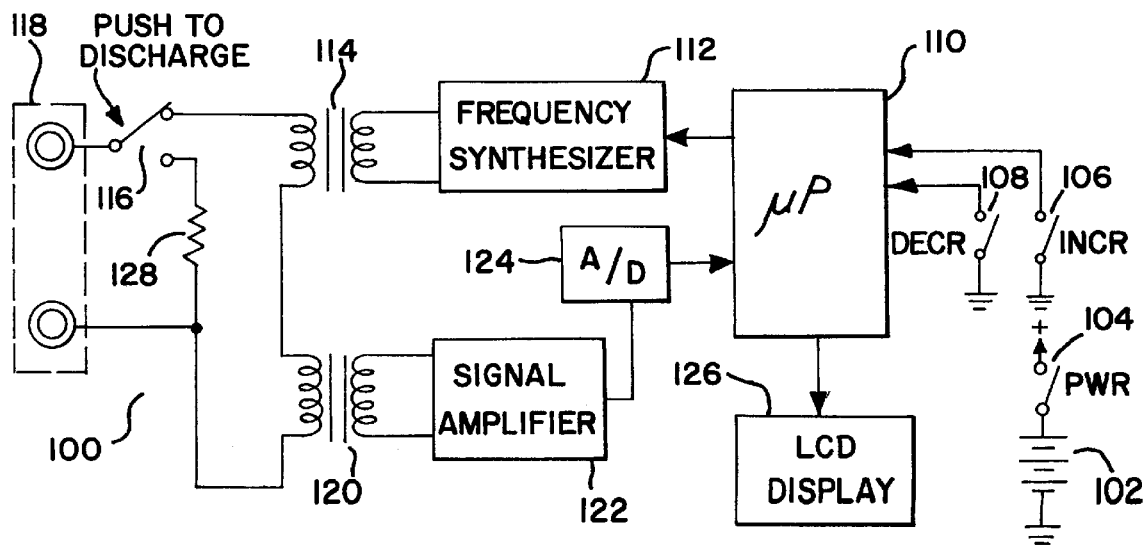
FIG. 7 is a simplified functional block diagram of the in-circuit capacitor checker of FIG. 6.

FIGS. 6 and 7 show a microprocessor implementation of an in-circuit capacitor checker circuit 100 constructed according to the teachings of the present invention. The in-circuit capacitor checker 100 receives power from a battery 102. The positive terminal of the battery 102 is selectively coupled and decoupled to the positive voltage supply through a power switch 104. The negative terminal of the battery 102 is coupled to ground.

The in-circuit capacitor checker 100 contains two switches; an increment switch 106 and a decrement switch 108, which are coupled to a microprocessor 110 and perform the function of a test value select switch. The microprocessor 110 then generates the appropriate control signal for the frequency synthesizer 112. The frequency synthesizer 112 receives the control signal and generates a test signal to be coupled to the capacitor to be tested via a transformer 114, a discharge switch 116, a pair of probes 118, and a second transformer 120. Each probe is coupled to a different lead of the capacitor to be tested. Transformer 114 isolates the frequency synthesizer 112 from the capacitor or any other external stimulus that may be attached to the probes 118, while allowing the test signal to be applied to the capacitor via the transformer's mutual inductance. Similarly transformer 120 isolates the signal amplifier 122 from the capacitor under test while still allowing the signal amplifier to sense the resulting reactance.

The signal amplifier then amplifies the signal associated with the resulting reactance and transmits the amplified signal to the analog-to-digital converter 124. The analog-to-digital converter 124 converts the analog signal received into a digital signal, which it sends to the microprocessor 110. The microprocessor 110 then processes the data, including comparing the data with the stored model data, and generates display data to be sent to a liquid crystal display 126. The liquid crystal display 126 then displays the results of the comparison including the capacitance value tested for.

Discharge switch 116 decouples the probes 118 and the capacitor under test from the rest of the circuit. The discharge switch then couples a current limiting resistor 128 across both leads of the capacitor under test for the purpose of discharging any stored charge. Discharging the capacitor prior to testing is important because any stored charge may cause the circuit to give erroneous results.

Figure 8:
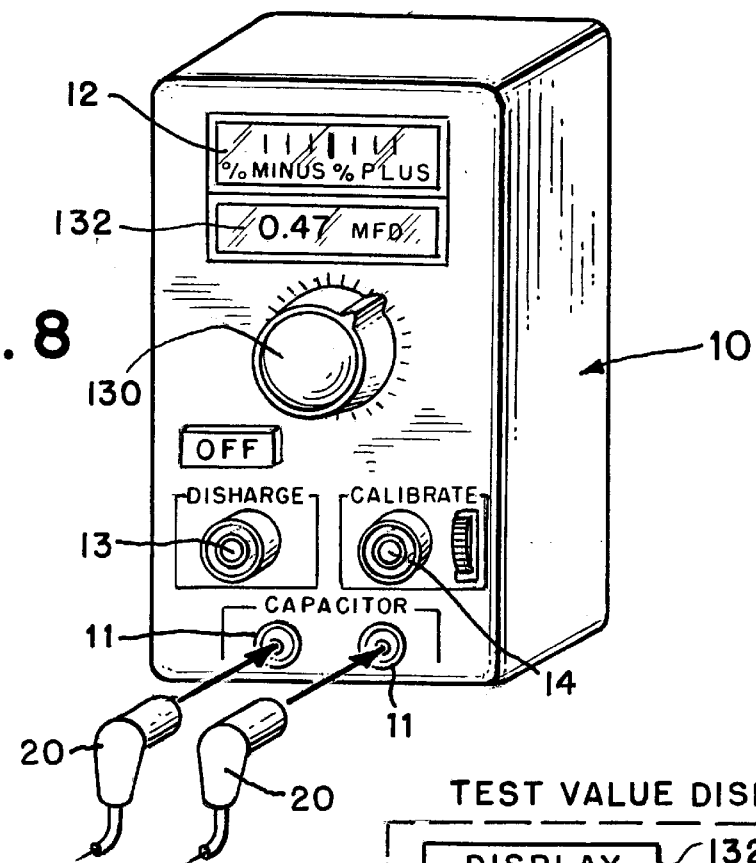
FIG. 8 is a perspective view of an alternate form of the test instrument of FIGS. 1–3 incorporating a digital readout of selected designed capacitance.
Figure 9:
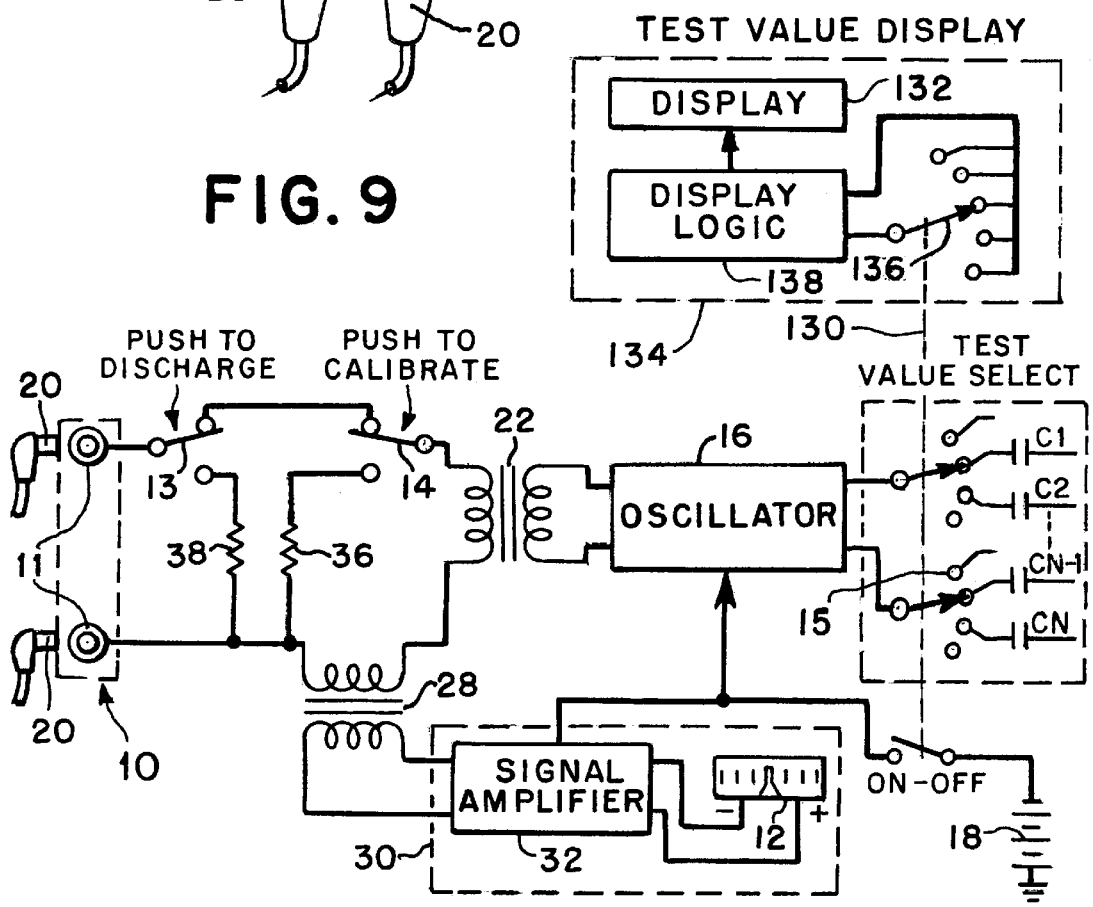
FIG. 9 is a simplified functional block diagram, partially in schematic form, of the in-circuit capacitor checker of FIG. 8.

FIG. 8 and 9 illustrate an alternative embodiment of the capacitor checker of FIGS. 1–3 wherein a digital display 132 is provided to indicate the selected designated capacitance. This feature, which obviates the need for indicating indicia around selector knob 15, is provided by an additional indicator circuit 134 contained within housing 10. This circuit includes a selector assembly 130 comprising a selector switch 136 mechanically coupled to selector switch 15 and a logic circuit 138 for driving display 132 in accordance with the position of switch 132.

By providing a large LCD display of the designated capacitance selected, the embodiment of FIGS. 8 and 9 avoids the necessity of a repairman having to read the smaller indicia associated with selector 15 in FIG. 1, thus making the test process more accurate and less time consuming.

Figure 10:
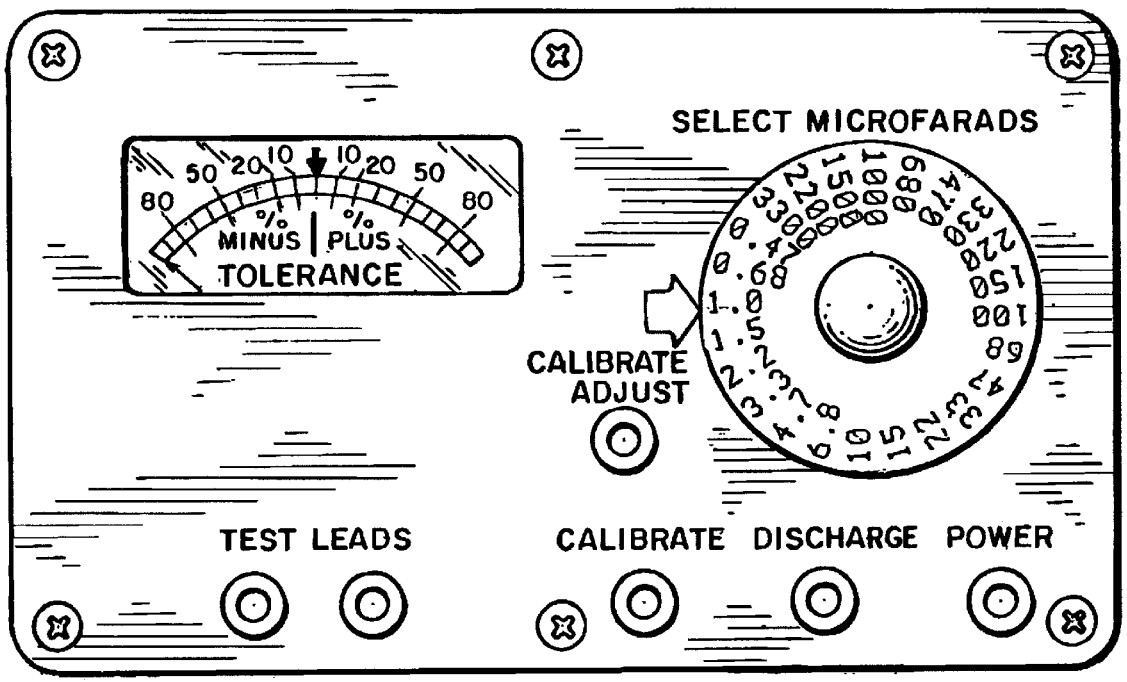
FIG. 10 is an alternate form of housing for the in-circuit capacitor checker of FIGS. 1–3.
Figure 11:
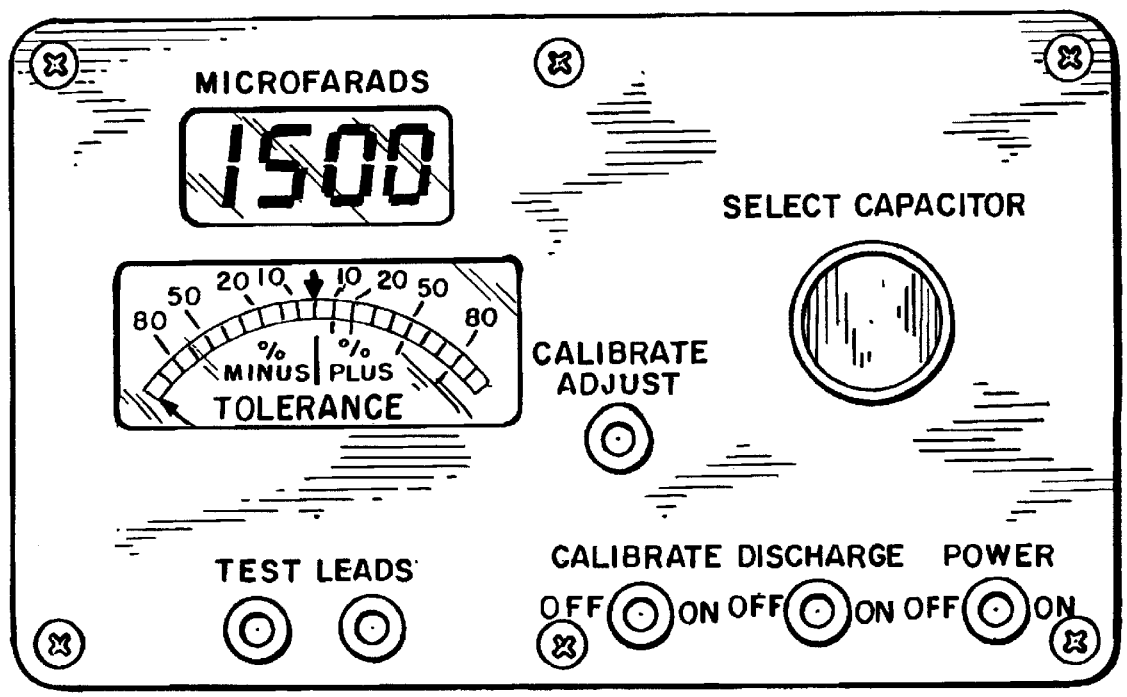
FIG. 11 is an alternate form of housing for the in-circuit capacitor checker of FIGS. 8 and 9.

FIGS. 10 and 11 shows an alternative housing for the embodiments of FIGS. 1–3 and FIGS. 8 and 9, respectively, wherein an enlarged flat control panel is presented to the user. The function of the various controls in this alternative are identical to those of FIGS. 1 and 3, and FIGS. 8 and 9, except that the power switch is separate from the designated capacitance select switch in each case.

While particular embodiments of the invention have been shown and described, it will be obvious to those skilled in the art that changes and modifications may be made therein without departing from the invention in its broader aspects, and, therefore, the aim in the appended claims is to cover all such changes and modifications as fall within the true spirit and scope of the invention.

I claim:

1. A capacitor test apparatus for indicating the deviation of a capacitor under test from its nominal capacitance value, said test apparatus comprising:

an oscillator including a user-actuated multi-position switch, said switch including a switch position corresponding to each of a plurality of nominal capacitance values, said oscillator generating a predetermined output signal frequency for each of said switch positions;

a probe circuit for applying said oscillator output signal to said capacitor under test;

a meter connected between said capacitor under test and said oscillator for indicating the relative current through said capacitor resulting from said oscillator output signal;

said predetermined oscillator output signal frequencies generated for each of said switch positions being such that when applied to reference capacitors of the nominal capacitance values associated with said switch positions a constant reading results on said meter; and the deviation of the meter reading exhibited by said capacitor under test from said constant meter reading with said oscillator switch set to the nominal capacitance of said capacitor indicating the deviation of said capacitor from its nominal capacitance value.

* * * * *